(12) United States Patent
Motohara

(10) Patent No.: US 8,625,879 B2
(45) Date of Patent: Jan. 7, 2014

(54) APPARATUS AND METHOD FOR MOUNTING AN INCLINED COMPONENT WITH RESPECT TO A SUBSTRATE

(75) Inventor: Hiroyuki Motohara, Hachioji (JP)

(73) Assignee: Olympus Corporation, Tokyo (JP)

( * ) Notice: Subject to any disclaimer, the term of this patent is extended or adjusted under 35 U.S.C. 154(b) by 624 days.

(21) Appl. No.: 12/858,773

(22) Filed: Aug. 18, 2010

(65) Prior Publication Data

US 2011/0043622 A1 Feb. 24, 2011

(30) Foreign Application Priority Data

Aug. 19, 2009 (JP) ................................. 2009-190275

(51) Int. Cl.
*G06K 9/00* (2006.01)
*H05K 3/30* (2006.01)
*G01B 11/02* (2006.01)

(52) U.S. Cl.
USPC .............................. 382/151; 29/834; 356/500

(58) Field of Classification Search
USPC ......................................................... 382/151
See application file for complete search history.

(56) References Cited

U.S. PATENT DOCUMENTS

| | | | | |
|---|---|---|---|---|
| 6,100,922 A * | 8/2000 | Honda et al. | .................... | 348/86 |
| 6,193,132 B1 * | 2/2001 | Shibata et al. | ................ | 228/103 |
| 6,203,082 B1 * | 3/2001 | Bendat et al. | ................ | 294/185 |
| 6,285,457 B2 * | 9/2001 | Ukaji | ............................ | 356/500 |
| 6,285,782 B1 * | 9/2001 | Inoue et al. | .................... | 382/145 |
| 6,649,926 B2 * | 11/2003 | Suhara et al. | ............ | 250/559.29 |
| 7,114,245 B2 * | 10/2006 | Ogimoto | ......................... | 29/739 |
| 7,423,743 B2 * | 9/2008 | Smets et al. | ............... | 356/237.1 |
| 8,156,642 B2 * | 4/2012 | Maenishi | ......................... | 29/834 |
| 2011/0173793 A1 * | 7/2011 | Motohara | .................. | 29/407.04 |

FOREIGN PATENT DOCUMENTS

| | | |
|---|---|---|
| JP | 2002-261491 | 9/2002 |
| JP | 2003-168899 A | 6/2003 |
| JP | 2004-87941 A | 3/2004 |
| JP | 2006-40978 A | 2/2006 |
| JP | 2007-201038 A | 8/2007 |

* cited by examiner

*Primary Examiner* — David Zarka

(74) *Attorney, Agent, or Firm* — Scully, Scott, Murphy & Presser, P.C.

(57) ABSTRACT

A mounting apparatus which mounts on a substrate, a component having an inclined surface which intersects with a contact surface of the substrate and the component, at an acute angle, includes a first light source having an optical path orthogonal to the contact surface, and a camera which picks up an image of the component and an image of the substrate, a second light source which irradiates light on the inclined surface, and a moving means which moves at least one of the component and the substrate relatively, in a plane parallel to the surface of contact, and reflected light which is irradiated from the second light source, and reflected by the inclined surface is incident on the image pickup section.

3 Claims, 6 Drawing Sheets

FIG.4A
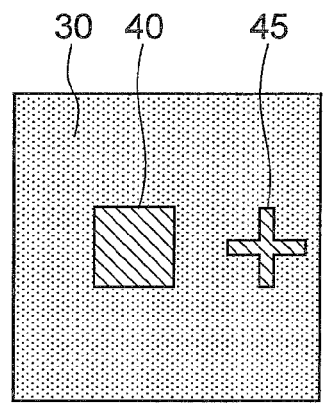
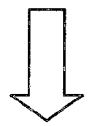
FIG.4B
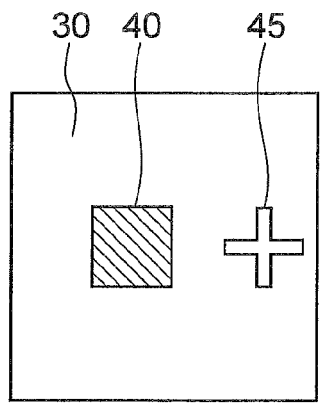

APPARATUS AND METHOD FOR MOUNTING AN INCLINED COMPONENT WITH RESPECT TO A SUBSTRATE

CROSS-REFERENCE TO RELATED APPLICATION

The present application is based upon and claims the benefit of priority from the prior Japanese Patent Application No. 2009-190275 filed on Aug. 19, 2009; the entire contents of which are incorporated herein by reference.

BACKGROUND OF THE INVENTION

1. Field of the Invention

The present invention relates to a mounting apparatus and a mounting method.

2. Description of the Related Art

As a mounting apparatus which improves an accuracy of mounting of a component on a substrate, a technology disclosed in Japanese Patent Application Laid-open Publication No. 2002-261491 is available. In amounting apparatus in which the substrate and the component are aligned in the same field of view of a camera, at the time of aligning a substrate and a component, the substrate and the component are irradiated by one light source by using a reflecting mirror, and position information is fetched via a camera, and mounting is carried out.

SUMMARY OF THE INVENTION

According to the present invention, there is provided a mounting apparatus which mounts on a substrate, a component having an inclined surface which intersects with a contact surface of the substrate and the component, at an acute angle, including
- a first light source having an optical path orthogonal to the surface of contact,
- an image pickup section which picks up an image of the component and an image of the substrate,
- a second light source which irradiates light on the inclined surface, and
- a moving means which moves at least one of the component and the substrate relatively, in a plane parallel to the surface of contact, and reflected light which is irradiated from the second light source, and which is reflected by the inclined surface is incident on the image pickup section.

BRIEF DESCRIPTION OF THE DRAWINGS

FIG. 4A and FIG. 4B are diagrams showing an image observed by a change in an amount of light;

DETAILED DESCRIPTION OF THE INVENTION

An embodiment of a mounting apparatus according to the present invention will be described below in detail by referring to the accompanying diagrams. However, the present invention is not restricted to the embodiment described below.

Figure 1:
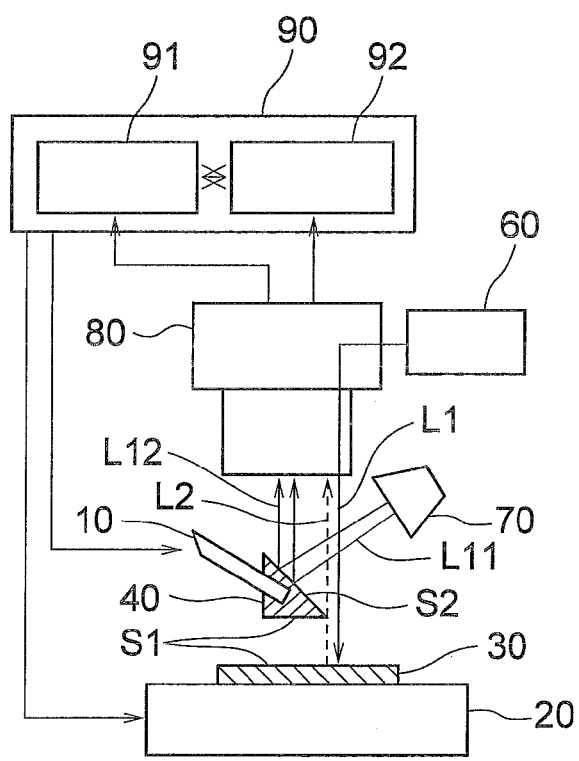
FIG. 1 is a diagram showing a schematic structure of a mounting apparatus according to an embodiment of the present invention.

FIG. 1 is a diagram showing a schematic structure of a mounting apparatus according to the embodiment of the present invention.

The mounting apparatus includes a manipulator 10, a camera 80, a first light source 60 and a second light source 70, a stage 20, and a control section 90 having calculating sections 91 and 92. The manipulator 10 is capable of holding and handling a component 40. Moreover, the manipulator 10 mounts by placing the component 40 on a substrate 30.

The camera 80 (an image pickup section) picks up an image of the component 40 and the substrate 30. The calculating sections 91 and 92 compute positions of the component 40 and the substrate 30 based on information which has been picked up by the camera 80. An order of calculating will be described later.

Irradiated light L1 emerged from the first light source 60 is incident on the substrate 30 by at least a part of the substrate 30, or in other words, by an optical path orthogonal to a contact surface S1 of the substrate 30 and the component 40. Moreover, an arrangement is such that, the irradiated light L1 is reflected at the substrate 30, and is incident on and picked up as an image as reflected light L2 at the camera 80. Furthermore, an arrangement is such that, light emerged from the second light source 70 is reflected at least at a part of the component 40, or in other words, at a surface S2 intersecting at an acute angle with the contact surface S1, and is incident on and picked up as an image at the camera 80.

When an amount of light of the first light source 60 is changed, an amount of light reflected at the substrate 30 and incident on the camera 80 changes. Whereas, an arrangement is such that, a change in an amount of light which is reflected at the component 40, and incident on the camera 80 is smaller compared to the change in the amount of light reflected from the substrate 30. This will be described below in detail.

Figure 3:
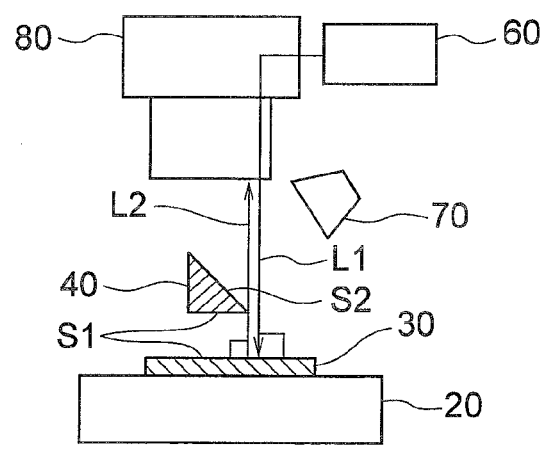
FIG. 3 is a diagram describing a relationship between a first light source and a substrate.

FIG. 3 is a diagram describing a relationship of the irradiated light L1 from the first light source 60, the substrate 30, and the reflected light L2. Here, FIG. 4A and FIG. 4B show an image when the substrate 30, the component 40, and an alignment mark 45 are observed by the camera 80.

The alignment mark 45 for aligning has been formed on the substrate 30 by a method such as a vapor deposition. When a change is made such that the amount of light of the first light source 60 is increased, an amount of light reflected from the substrate 30 and the alignment mark 45 on the substrate 30 changes.

FIG. 4A shows an image observed before the amount of light of the first light source 60 is increased. FIG. 4B shows an image observed after the amount of light of the first light source 60 is increased. When the amount of light is increased, the substrate 30 and the alignment mark 45 on the substrate 30 of which the images are picked up by the camera 80, becomes bright images as shown in FIG. 4B.

However, even when the amount of light of the first light source 60 is increased, the change in the amount of light reflected from the component 40 is small. Therefore, a change in lightness and darkness of the image of the component 40 which is picked up by the camera 80 is small.

The calculating section 91 computes a position of the substrate 30 by image processing based on light (substrate alignment image) which is incident on the camera 80 upon being reflected at the substrate 30.

Next, an image observed by irradiation from the second light source 70 will be described by referring to FIG. 5, FIG. 6A, and FIG. 6B.

Figure 5:
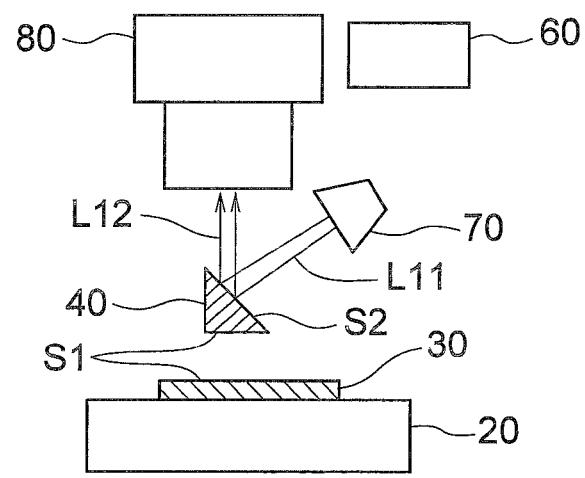
FIG. 5 is a diagram describing a relationship between a second light source and a component.

FIG. 5 is a diagram describing a relationship of irradiated light L11 from the second light source 70, the component 40, and reflected light L12. Here, FIG. 6A and FIG. 6B show images when the substrate 30, the component 40, and the alignment mark 45 are observed by the camera 80.

An arrangement is such that light emerged from the second light source 70 is reflected by at least apart of the component 40, and is incident on and picked up as an image at the camera 80. Concretely, the irradiated light L11 from the second light source 70, after being reflected at a surface S2 intersecting at an acute angle with the contact surface S1 of the substrate 30 and the component 40, or in other words, an inclined surface of a prism which is the component 40, becomes light L12 which is reflected toward the camera 80.

Figure 6A:
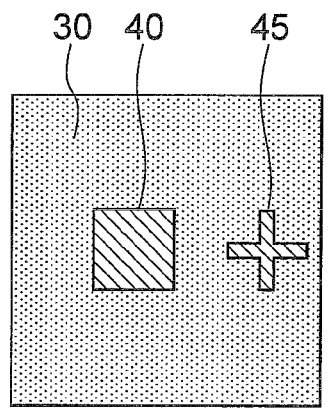
FIG. 6A and FIG. 6B are other diagrams showing an observed image by change in an amount of light.

FIG. 6A shows an image observed before increasing an amount of light of the second light source 70. FIG. 6B shows an image observed after the amount of light of the second light source 70 has been increased. When the amount of light of the second light source 70 has been increased, the amount of light which is reflected at the inclined surface S2 of the component 40 and incident on the camera 80 changes to become bright. Whereas, the change in the amount of light which is reflected at the substrate 30 and incident on the camera 80 is small.

In this manner, when the amount of light of the second light source 70 is increased, the amount of light reflected from the component 40 becomes substantial, and the component 40 of which, the image is picked up by the camera 80 becomes a bright image. At this time, the change in the amount of light reflected from the substrate 30 and the alignment mark 45 on the substrate 30 is small. Therefore, a change in lightness and darkness of the image of the substrate 30 and the alignment mark 45 on the substrate 30 picked up by the camera 80 is small.

The calculating section 92 computes a position of the component 40 by image processing based on light (component image) which is incident on the camera 80 upon being reflected at the component 40.

Figure 6B:
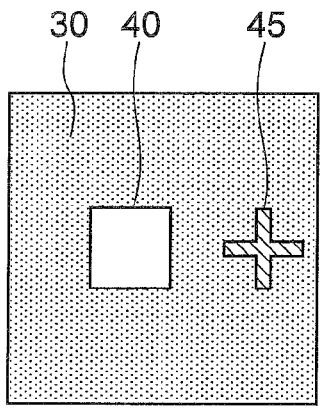

When the amount of light of the second light source 70 is increased, a contrast ratio of the substrate 30 and the component 40 becomes high, as shown in FIG. 6B. Therefore, an image identification of the component 40 is carried out accurately.

Here, an arrangement is made such that a luminance difference of a boundary area between an image of the surface S2 which intersects at an acute angle with the contact surface S1 which is picked up by the camera 80, and an image of the substrate 30 which is picked up by the camera 80 can be identified as an image.

In the embodiment, as it has been described above, as the component 40, a case of an arrangement having an inclined surface as of a prism, and an image pickup surface is an inclined surface S2 is shown. Conventionally, a control of irradiation of an appropriate amount of light on an inclined surface had been complicated, and a desired contrast could not be achieved.

According to the embodiment, by providing the second light source 70 exclusively for the component 40, an amount of light appropriate for identifying an image can be irradiated to each of the substrate 30 and the component 40. As a result, an accurate identification of image and detection of position information have become possible.

Moreover, the control section 90 controls the manipulator 10 and the stage 20 based on calculation result from the calculating sections 91 and 92. Furthermore, the alignment of the substrate 30 and the component 40 is carried out in a direction within a plane parallel to the substrate 30. Finally, the component 40 is mounted on the substrate 30 and an adhesive is cured by UV light. As a result, the component 40 can be mounted on the substrate 30.

Figure 2:
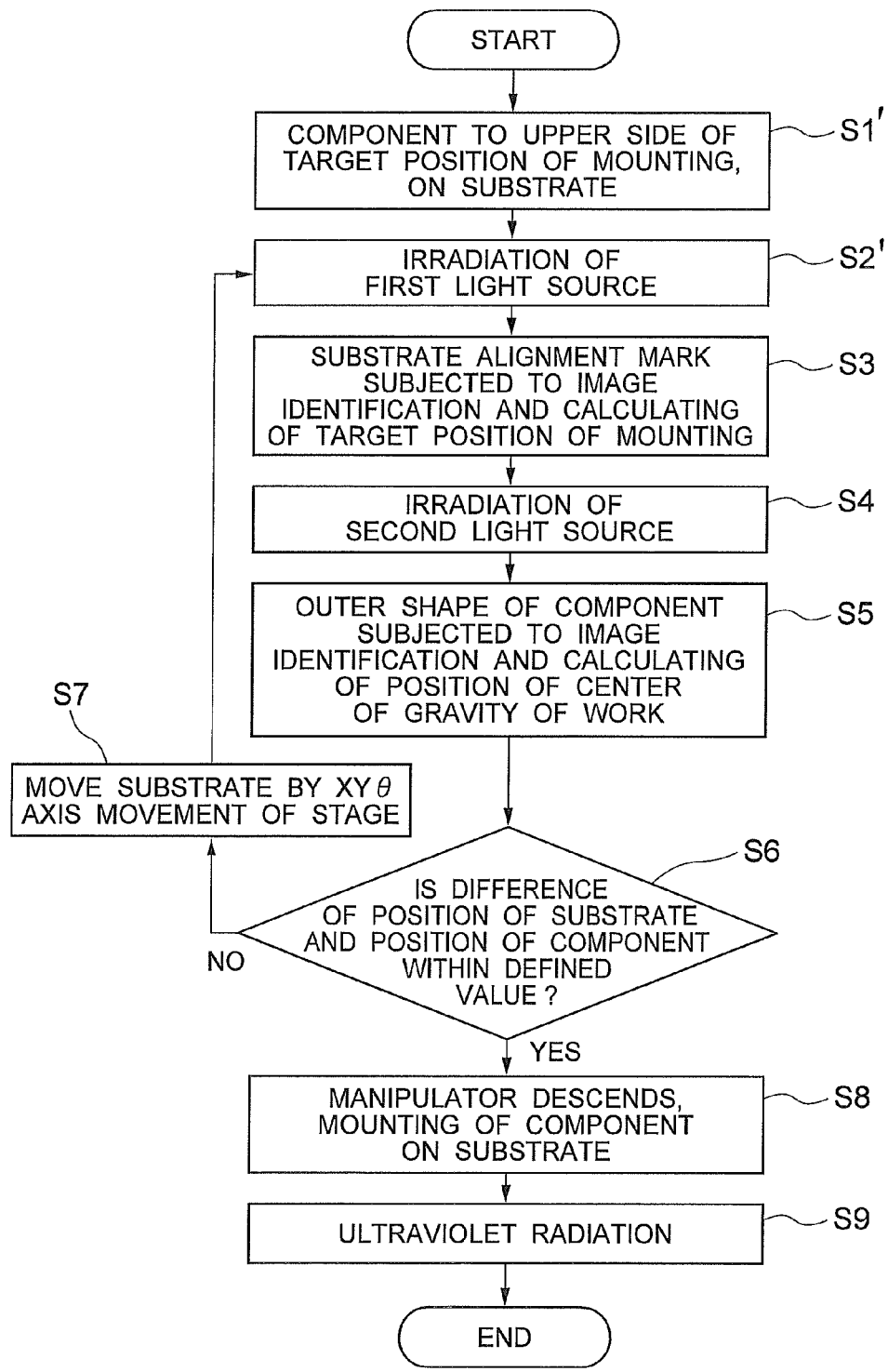
FIG. 2 is a flowchart describing a flow of a mounting method.

Next, coming back to FIG. 2, a flow of a mounting method will be described below.

At step S1', the component 40 held by the manipulator 10 is disposed at an upper side of a target position of mounting on the substrate 30, which has been stored in advance, by XYθ axis movement of the stage 20.

At step S2', the first light source 60 irradiates light on the substrate 30.

At step S3, an image of the alignment mark 45 on the substrate 30 is subjected to image identification, and the target position of mounting is calculated by the calculating section 91.

At step S4, the second light source 70 irradiates light on the component 40.

At step S5, an outer shape of the inclined surface S2 of the component is subjected to image identification, and a position of the component 40, such as a position of a center of gravity is computed by the calculating section 92.

Moreover, regarding the image of the inclined surface S2 which is picked up by the camera 80, an inclination of the component 40 can be detected by a size of the image.

At step S6, a judgment of whether or not a difference in the position of the substrate 30 and the position of the component 40 which have been computed at step S3 and step S5, is within a defined value, is made.

When a judgment result is affirmative (Yes), in other words, when the difference is within the defined value, the process advances to step S8.

Whereas, when the judgment result is negative (No), or in other words, when the difference is not within the defined value, the process advances to step S7, the substrate 30 is moved within a plane parallel to the contact surface S1 by XYθ axis movement of the stage 20, and thereafter, upon returning to step S2', steps from step S2' to step S6 are repeated.

At step S8, the alignment of the substrate 30 and the component 40 is completed, and the manipulator 10 which holds the component 40 descends, and mounts the component 40 on the substrate 30.

At step S9, adhesive is cured by UV irradiation, and the process is completed.

Steps 2 and 3 of computing the target position of mounting and steps 4 and 5 of computing the position of the component 40 can be carried out upon interchanging an order.

In this manner, according to the embodiment, a difference in contrast of the substrate 30 and contrast of the component 40 becomes clear. Therefore, the identification of image becomes easy, and even with the component 40 with a shape having an inclined surface, such as a prism, the accurate alignment of the substrate 30 and the component 40 becomes possible. Moreover, since the complicated control is unnecessary, a simple and low-cost mounting with a high degree of accuracy of mounting becomes possible.

As it has been described above, the mounting apparatus and the mounting method according to the present invention are useful for a mounting apparatus with a high degree of accuracy of mounting, and particularly, are suitable when the component has a shape having an inclined surface, such as a prism.

In the mounting apparatus and the mounting method according to the present invention, a light source which irradiates light on an inclined surface of a prism for example, has been disposed at a position such that, light reflected from the inclined surface is incident on a camera which picks up an image of a component and a substrate. Accordingly, even when the component has a shape having an inclined surface, such as a prism, it is possible to irradiate an amount of light appropriate for the shape of the component. As a result, there is shown an effect that an accurate detection of position is carried out easily, and the accuracy of mounting is high.

What is claimed is:

1. A mounting apparatus which mounts, a component having an inclined surface having a non-parallel relationship with a surface of a substrate, the apparatus comprising:
   a first light source having a first optical path orthogonal to the surface of the substrate, which irradiates the surface of the substrate;
   a second light source having a second optical path which intersects the first optical path and irradiates light on the inclined surface;
   an image pickup section which picks up a first image of the surface of the substrate and a second image of the inclined surface of the component, which are irradiated by the first light source and the second light source, and which form first and second observed images, respectively;
   a first calculating section which computes a position of the substrate based on the first and second observed images, where one of the first and second observed images is picked up before increasing an amount of light from the first light source, and the other of the first and second observed images is picked up after increasing the amount of light from the first light source;
   a second calculating section which computes a position of the component based on the first and second observed images, where one of the first and second observed images is picked up before increasing an amount of light from the second light source, and the other of the first and second observed images is picked up after increasing the amount of light from the second light source; and
   a moving means which moves at least one of the component and the substrate relatively, in a plane parallel to the substrate based on a calculation result of the first and second calculating sections.

2. A method for mounting a component having an inclined surface having a non-parallel relationship with a surface of a substrate, the method comprising:
   a first irradiation step having a first optical path orthogonal to the surface of the substrate, which irradiates the surface of the substrate;
   a second irradiation step having a second optical path which intersects the first optical path and irradiates the inclined surface of the component;
   an image pickup step which picks up a first image of the surface of the substrate and a second image of the inclined surface of the component, which are irradiated in the first irradiation step and the second irradiation step, and which form first and second observed images, respectively;
   a first calculating step which computes a position of the substrate based on the first and second observed images, where one of the first and second observed images is picked up before increasing an amount of light in the first irradiation step, and the other of the first and second observed images is picked up after increasing the amount of light of the first irradiation step;
   a second calculating step which computes a position of the component based on the first and second observed images, where one of the first and second observed images is picked up before increasing an amount of light of the second irradiation step, and the other of the first and second observed images is picked up after increasing the amount of light of the second irradiation step; and
   a moving step of moving at least one of the component and the substrate relatively, in a plane parallel to the surface of the substrate based on a calculation result of the first calculating step and of the second calculating step.

3. A mounting method according to claim 2, wherein the first calculating step computes the position of the substrate based only on the first observed image of the surface of the substrate irradiated by the first irradiation step, and
   the second calculating step computes the position of the inclination surface of the component based only on the second observed image of the inclination surface of the component irradiated by the second irradiation step.

* * * * *